(12) United States Patent
Lee et al.

(10) Patent No.: US 10,878,900 B2
(45) Date of Patent: Dec. 29, 2020

(54) METHOD FOR USING ELECTROCHEMICAL COMPONENTS FOR STORAGE OF ENERGY AND INFORMATION AND ASSOCIATED ELECTRONIC CIRCUIT

(71) Applicant: COMMISSARIAT A L'ENERGIE ATOMIQUE ET AUX ENERGIES ALTERNATIVES, Paris (FR)

(72) Inventors: Daeseok Lee, Grenoble (FR); Gabriel Molas, Grenoble (FR); Sami Oukassi, Saint-Egreve (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/475,195

(22) PCT Filed: Dec. 22, 2017

(86) PCT No.: PCT/EP2017/084335
§ 371 (c)(1),
(2) Date: Jul. 1, 2019

(87) PCT Pub. No.: WO2018/122156
PCT Pub. Date: Jul. 5, 2018

(65) Prior Publication Data
US 2019/0341105 A1 Nov. 7, 2019

(30) Foreign Application Priority Data
Jan. 2, 2017 (FR) ...................... 17 50005

(51) Int. Cl.
*G11C 13/00* (2006.01)
*H01L 27/24* (2006.01)
*H01L 45/00* (2006.01)

(52) U.S. Cl.
CPC ........ *G11C 13/0011* (2013.01); *G11C 13/004* (2013.01); *G11C 13/0007* (2013.01);
(Continued)

(58) Field of Classification Search
CPC ............ G11C 13/0011; G11C 13/0007; G11C 13/004; G11C 13/0073; G11C 2013/0073;
(Continued)

(56) References Cited

U.S. PATENT DOCUMENTS 7,785,737 B2   8/2010 Teeters
9,001,558 B2   4/2015 Rosezin et al.
(Continued)

OTHER PUBLICATIONS

International Search Report as issued in International Patent Application No. PCT/EP2017/084335, dated Mar. 15, 2018.
(Continued)

*Primary Examiner* — Sung Il Cho
(74) *Attorney, Agent, or Firm* — Pillsbury Winthrop Shaw Pittman LLP (57) ABSTRACT

A solution for using elementary electrochemical components, manufactured from the same arrangement of materials and incorporated in a single electronic circuit, for information storage or for energy storage, is presented. Electrochemical components incorporating a first electrode, a second electrode and an active area between the two, can, by the application of different voltages for switching from a highly resistive state to a weakly resistive state or for switching from a state having one given electromotive force to a state having another electromotive force, be used respectively as a memory or as a battery.

9 Claims, 10 Drawing Sheets

(52) U.S. Cl.
CPC ...... *G11C 13/0038* (2013.01); *H01L 27/2463* (2013.01); *H01L 45/085* (2013.01); *H01L 45/1233* (2013.01); *G11C 2013/009* (2013.01); *G11C 2013/0073* (2013.01)

(58) Field of Classification Search
CPC .......... G11C 2013/009; H01L 27/2463; H01L 45/085; H01L 45/1233
USPC .......................................................... 365/148
See application file for complete search history.

(56) References Cited

U.S. PATENT DOCUMENTS

| | | | | |
|---|---|---|---|---|
| 9,112,145 | B1* | 8/2015 | Lu | H01L 45/145 |
| 9,502,102 | B1* | 11/2016 | Kumar | H01L 45/1608 |
| 2010/0008128 | A1* | 1/2010 | Yoshii | H01L 45/12 |
| | | | | 365/148 |
| 2015/0129829 | A1* | 5/2015 | Kumar | G11C 13/003 |
| | | | | 257/5 |
| 2016/0071565 | A1 | 3/2016 | Lemke | |
| 2018/0175291 | A1* | 6/2018 | Chu | G11C 13/0007 |

OTHER PUBLICATIONS

Valov, I., et al. "Nanobatteries in redox/based resistive switches require extension of memristor theory," nature communications, vol. 4, Apr. 2013, XP055403546, 9 pages.

Lee, D., et al., "Memory and Energy Storage Dual Operation in Chalcogenide-Based CBRAM," IEEE Journal of the Electron Devices Society, vol. 5, No. 4, Jul. 2017, XP011653517, pp. 283-287.

Kozicki, M, N., et al. "Conductive bridging random access memory—materials, devices and applications," Semiconductor Science and Technology, IOP Publishing, vol. 31, No. 11, Oct. 2016, XP020309909, 32 pages.

* cited by examiner

METHOD FOR USING ELECTROCHEMICAL COMPONENTS FOR STORAGE OF ENERGY AND INFORMATION AND ASSOCIATED ELECTRONIC CIRCUIT

CROSS REFERENCE TO RELATED APPLICATIONS

This application is the U.S. National Stage of PCT/EP2017/084335, filed Dec. 22, 2017, which in turn claims priority to French Patent Application No. 1750005 filed Jan. 2, 2017, the entire contents of all applications are incorporated herein by reference in their entireties.

TECHNICAL FIELD

This invention relates to a method for using electrochemical components for energy and information storage and to the associated electronic circuit. It has applications, in particular, in the field of integrated electronics.

PRIOR ART

The use of electrochemical components with micro or nanometric dimensions for the integration of electronic circuits is widely known by those skilled in the art. The resistive random access memories are an illustration of this and, in particular, resistive random access memories of the OxRRAM (Oxide Resistive Random Access Memory) and CBRAM (Conductive Bridging Random Access Memory) type.

These two types of resistive random access memory are based on an arrangement comprising a first electrode, a second electrode and an active area located between the two electrodes. It is the fact that this active area can switch from an insulating state to a conducting state by applying an external voltage that makes it possible to carry out the memory function in both cases.

Indeed, the information, in the form of binary data, is stored in these components through their state which can either be a high resistance state (HRS) which correspond to a state referred to as "OFF" or a low resistance state (LRS) which corresponds to a state referred to as "ON".

The switching between the two states of this type of memory component, whether OxRRAM or CBRAM, therefore takes place under the effect of the application of a determined voltage. This voltage causes the creation in the active area of a conductive path, of which the type and the form varies according to the embodiments, and which induces this switching.

The difference between the two types of memory resides in the use, for OxRRAMs, of an active area with a material with an oxide base, such as a binary transition oxide, in which a conducting channel or channels are formed by oxygen gaps, while in the case of CBRAMs, the active area incorporates an ion-conductive material and the conducting channel or channels are formed from ions coming from a soluble metal electrode and/or dispersed in the active area.

Several solutions of prior art are part of an optic of enlarging the possibilities offered by this type of components.

The article de Nature Communications, Valov et al, 2784, 2013 describes, for example, the use of the physical properties of a component of the resistive memory type, of which the operation is based on the occurrence of oxidation-reduction reactions, in order to obtain an intrinsic electromotive force or emf coming from the movement of the ions.

The authors therefore experimentally and theoretically demonstrate the existence, in this type of component (here a resistive memory), of an emf resulting from the creation of various chemical potential gradients between the two electrodes of the component when no conductive path of the filament type is created between the latter.

This electromotive force is considered to be a voltage generated by the component and can be obtained by dissolution of an electrode active in the active area (here an electrolyte) by a electrochemical process, this is what the authors consider as being the demonstration of a "nano-battery" effect.

However, the authors conclude that the electromotive force observed (and the associated nano-battery effect) can only suggest the existence of a nano-battery effect and propose the extension of the theoretical models to even describe the physical phenomena that govern the operation of resistive memories by incorporating this effect.

The article therefore does not disclose all of the characteristics required for the operation of a component for energy storage and does not describe the concrete feasibility of such an application. In particular, the electromotive force is measured only in the oxidised state which would correspond solely to the discharged state of a battery. In addition, no demonstration of the repeatability or of the reversibility of the phenomena described within the component is made.

U.S. Pat. No. 9,001,558B2 describes an array of resistive memories of the CBRAM type and discloses a non-destructive method for reading the state (0 or 1) of the memories of this array based on the use of electromotive force. The electromotive force is thus used in a component that was originally designed for information storage. The invention only relates to a method of reading memory states and in no way mentions a possible use of this force for energy storage.

Inversely, U.S. Pat. No. 7,785,737B2 discloses using batteries of nanometric dimensions, called nano-batteries, for information storage. The principle described in this document is based on the fact that these nano-batteries, which have a structure of the electrode/electrolyte/electrode type, produce a given voltage by application of an external current. As this voltage is linked to the material used, different nano-batteries, formed by different structures, therefore deliver different voltages. These various values of voltage, assimilated with states (for example 0 or 1), can be used to store information.

Each logic state corresponds to a charge state of a nano-battery. A component formed from a specific arrangement of materials can therefore store two different states. However, the kinetics of changes in state associated with this type of device is very slow and limits, because of this, the applications that can be carried out with such components.

SUMMARY OF THE INVENTION

The invention proposed offers a solution to the technical problem of an electrochemical component for two different purposes, inexpensively and making use of simple manufacturing. It makes it possible in fact to use electrochemical components, composed of the same materials and according to the same arrangement, to carry out the storage of energy or to carry out the storage of information.

For this purpose, an aspect of the invention relates to a method for using a plurality of elementary electrochemical components incorporated in an electronic circuit, said components comprising three layers, formed from the same materials and having the same thickness, said three layers comprising respectively a first electrode, a second electrode, and an active area between said first and second electrodes, said components able to be used for information storage or for energy storage, said method comprising:
- a step in which at least one component is used for information storage via the formation and the dissolution of a conductive path between said first and second electrodes in order to switch said component from a low resistance state to a high resistance state, and reciprocally, by respectively applying a first and a second external voltage to said component;
- a step in which at least one other component is used for energy storage via the injection of ions coming from the first electrode and without forming a conductive path, in the active area in order to switch the component from a first high resistance state, associated with a first value of electromotive force, to a second high resistance state, associated with a second value of electromotive force, and reciprocally, by respectively applying a third external voltage different from the first external voltage and/or a first current and a fourth external voltage to said component and/or a second current.

Based on the method according to the invention, it is possible for a plurality of identical elementary electrochemical components incorporated in an electronic circuit to use at least one component for information storage and at least one component for energy storage. In other words, it is possible, via this method, to use the same component without changing the structure thereof as a memory or as a battery.

The method therefore reduces the steps of manufacturing involved by requiring, for example, the use of fewer materials and by making the integration easier on the same circuit. Indeed, since the same components incorporated in a single circuit can carry out a memory or a battery function, it is possible to manufacture products that are more compact, save more energy and which therefore are more economical.

In addition to the characteristics mentioned hereinabove, the method according to the invention can have one or several of the following complementary characteristics, taken individually or in any technically permissible combinations:
- the elementary electrochemical component or components incorporated in the electronic circuit and used for energy storage are used for supplying with energy and controlling at least one portion of the other electrochemical components used for information storage;
- at least one elementary electrochemical component is retained in an initial or high resistance state which allows a user of said circuit to choose to use this or these components for information storage or for energy storage;
- the elementary electrochemical component or components incorporated in the electronic circuit and used for energy storage are used for supplying with energy one or several other integrated circuits on the same chip.

Another aspect of the invention relates to an electronic circuit that incorporates a plurality of electrochemical components said components comprising three layers, formed from the same three materials and having the same thickness, said three layers comprising respectively a first electrode, a second electrode, and an active area between said first and second electrodes, said components able to be used for information storage or for energy storage, said electronic circuit comprising means for implementing the method of the invention.

In addition to the characteristics mentioned hereinabove, the circuit according to the invention can have one or several of the following complementary characteristics, taken individually or in any technically permissible combinations:
- the components can be formed by an arrangement of layers of material of the "CBRAM" memory type comprising a first soluble metal electrode, a second metal electrode and an electrolyte between said first and second electrodes;
- the components can be formed by an arrangement of layers of material of the "OxRRAM" memory type comprising a first electrode, a second electrode and a material with an oxide base between said first and second electrodes;
- the active areas located between said first and second electrodes of the components can be composed of materials chosen from the following materials: sulphide material or silicon oxide or transition metal oxide;
- the surface of the components used for energy storage can be adapted to supply with energy and operate components used for information storage that have a predetermined surface and number of operating cycles.

BRIEF DESCRIPTION OF THE DRAWINGS

Other characteristics and advantages of the invention shall appear when reading the following description of non-limiting embodiments, in reference to the accompanying drawings and wherein.

DETAILED DESCRIPTION OF EMBODIMENTS

This invention is not limited to the embodiments presented here. Other alternatives and embodiments can be deduced and implemented by those skilled in the art when reading this description and the accompanying drawings.

Figure 1:
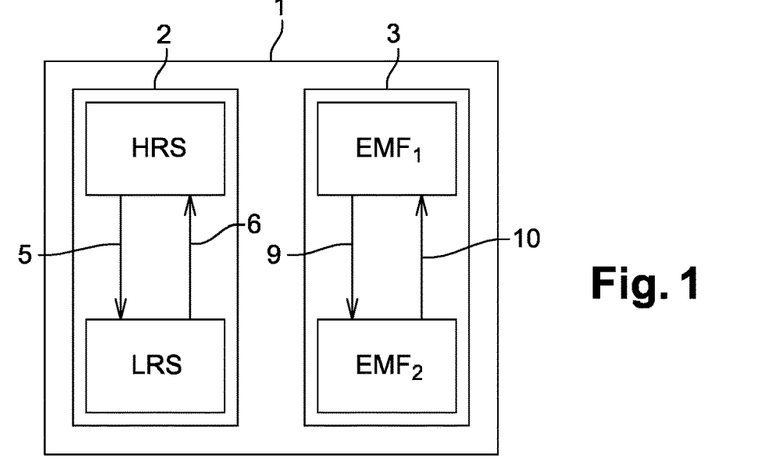
FIG. 1 shows an embodiment of the method of the invention.

FIG. 1 shows a diagram that describes an embodiment of the method 1 of the invention which comprises two steps: a step 2 of information storage and a step 3 of energy storage. More precisely, the step 2 carries out the information storage function for at least one elementary electrochemical component and the step 3 carries out the energy storage function for at least one other elementary electrochemical component. These elementary electrochemical components have the same structure, i.e. the same arrangement of layers (i.e. identical materials and identical thicknesses, with only the surface able to vary where applicable), and are incorporated in a single electronic circuit such as described in FIG. 2.

Figure 2:
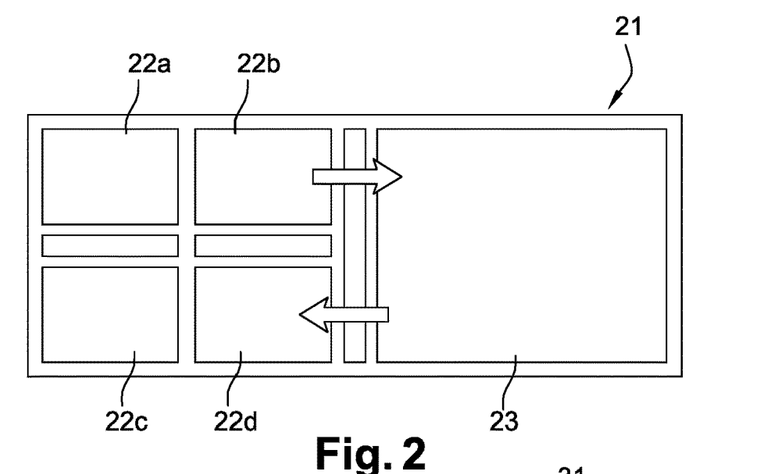
FIG. 2 shows an embodiment of the circuit according to the invention.

FIG. 2 shows an embodiment of the circuit according to the invention wherein a set of elementary electrochemical components, formed from the same arrangement and manufactured according to the same method of manufacture, are incorporated in a single integrated circuit 21 and are used to carry out, for at least one component, the information storage function, and for at least one other component, the energy storage function. In addition, the component or components used for information storage are, in this embodiment, supplied with energy/operated by the component or components used for energy storage. The example of FIG. 2 therefore diagrammatically describes 4 memory components 22a, 22b, 22c and 22d operated by a battery component 23 (of which the surface is greater than that of the memory components). Each component of this circuit 22a, 22b, 22c, 22d and 23 is formed from the same arrangement of materials such as the one described in FIG. 3.

Figure 3:
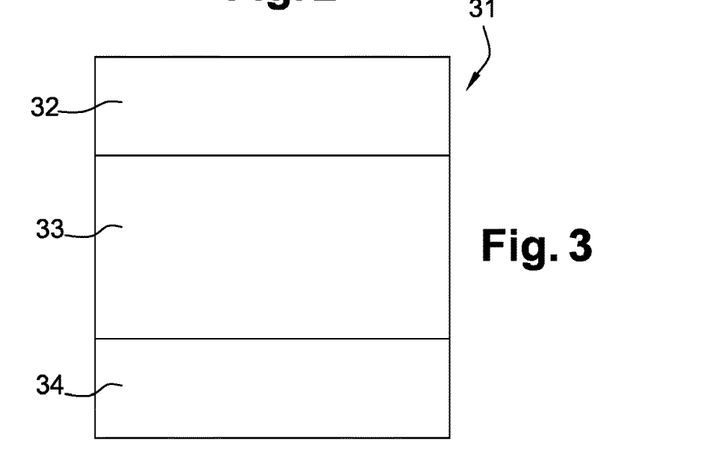
FIG. 3 is a diagrammatical representation of the arrangement forming a component of the resistive memory type.

FIG. 3 shows a diagrammatical representation of the structure (formed from an arrangement of different materials) of an elementary electrochemical component 31 in accordance with those of the invention. An active area 33, formed of a resistive material, which can for example be an electrolyte or an insulator, is located between a first electrode 32 and a second electrode 34.

In reference to FIG. 1, the step 2 of the method 1 comprises the action of switching from a high resistance state HRS to a low resistance state LRS and reciprocally by the formation 5 and the dissolution 6 of a conductive path in the active area 33 of a component by respectively applying a first and a second voltage. The step 3 comprises the action of switching from a state that has a given value of electromotive force $EMF_1$ to a state that has another value of electromotive force $EMF_2$ and reciprocally, respectively by an oxidation reaction 9 causing the injection of ions coming from the first electrode 32 without forming a conductive path in the active area 33 obtained by applying a third voltage and/or a first current and by a reduction reaction 10 obtained by applying a fourth voltage and/or a second current to the component.

The invention is therefore based on the use of electrochemical components that have an arrangement in layers of different materials that make it possible, among other things, to have them operate as resistive memories, and, in particular, as memories of the CBRAM type or as memories of the OxRRAM type. The following figures describe certain physical characteristics linked to the operation of these components which are used by the method of the invention in order to be able to use the components for energy storage and for information storage.

In a memory component of the CBRAM type, the first electrode can be designated as "working electrode" (which shall be called electrode W in what follows) meaning that this is the electrode wherein the reaction of interest (for the operation of the memory) is produced by opposition to the second electrode designated as "counter electrode" or "auxiliary electrode" (which shall be called electrode C in what follows) meaning that it is the electrode used to apply a current or a voltage between the two electrodes.

As described hereinabove, the operation of resistive memories is based on their capacity to reversibly switch between two different states of resistance by the application of an external voltage (also called bias). Thus through the application of a first voltage referred to as SET the memory switches from a high resistance state HRS to a low resistance state LRS and through the application of a second voltage referred to as RESET the memory carries out the reverse switching.

It is to be noted that, in addition to the two resistance states HRS and LRS that the component can have, the initial state, existing before these two states, is a state wherein the active area 33 has a resistance that is generally greater than the value of the resistance associated with the HRS state. This implies that an external voltage is applied beforehand to the component in order to be able to generate the LRS state for the first time before being able to reversibly switch from the LRS state to the HRS state.

Figure 4:
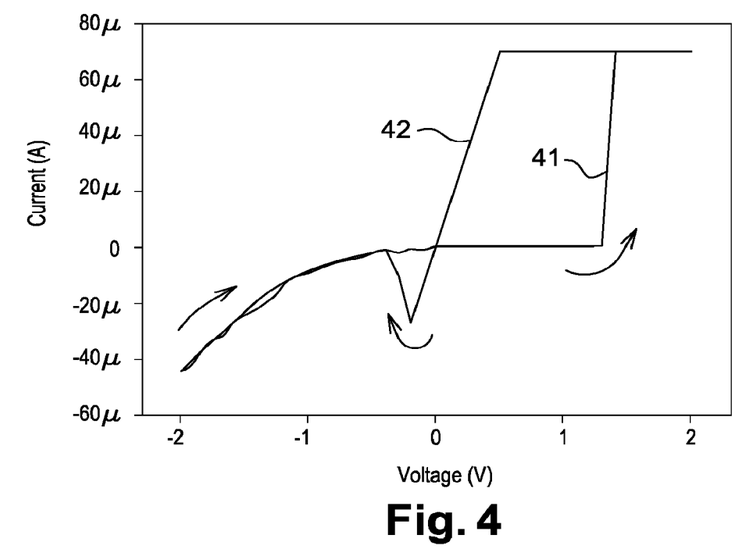
FIG. 4 shows a curve illustrating the switching between the two levels of resistance during the operation of a memory of the CBRAM type.

FIG. 4 is a current-voltage curve that relates to the operation of a memory of the CBRAM type and in particular to a case wherein the active area is formed from a layer of $GeS_2$. The curve shows the typical unfolding of the switching between the two levels of resistance at the origin of the operation of such a component in particular through an abrupt increase in the current 41 linked to the formation of a conducting filament then a drop in this same current 42 by dissolution of this filament. In these memories, the conductive path (here a filament) can be formed between the two electrodes via nucleation of ions initially provided by doping in the active area or by diffusions of metal ions coming from the soluble electrode in the active area during a process called FORMING. This is the path of which the distribution can be modified or which can be dissolved by the application of a specific external voltage causing a more or less substantial modification in the electrical conduction between the two electrodes. These latter steps, associated with the SET and with the RESET of the memory, allow for the switching between the HRS and LRS states.

Beyond the electrochemical reactions at the origin of this switching between high and low resistive states other electrochemical reactions can occur before the process of FORMING, i.e. in the initial state of a memory, but also in the high resistance state HRS. The article of Nature Communications mentioned hereinabove evokes, in a memory of the CBRAM type, the observation of other electrochemical reactions through a measurement of the cyclic voltammetry.

In particular, in an electrochemical component of which the operation is based on the occurrence of oxidation-reduction reactions and of which the arrangement is of the Ag/SiO$_2$/Pt type it is possible to oxidise the silver electrode (electrode W) by applying a positive voltage while a reduction reaction on the same electrode is produced by applying a negative voltage. The oxidation can result in the migration of the silver ions in the layer of SiO$_2$ which induces an electromotive force (emf). This emf can be considered as an energy delivered by a generator that results from a gradient of concentration in metal ions (here Ag ions) between the two electrodes. The emf of the oxidised state corresponds to the discharged state of a battery.

The method of the invention presented here entails, beyond the use of the emf of the oxidised state, the use of the emf of the reduced state. Carrying out a switch that is reversible between the values of emf that correspond to the oxidised and reduced state makes it possible to use the difference in emf as a source of energy. The passing from a first value of emf to a second value of emf results in a change in the state of charge on the structure. This state of charge is modified by the migration of a certain quantity of ions from one electrode to the other through the intermediate layer and finishes with a change in the state of oxidation of the ion in question. This oxidation-reduction mechanism is accompanied by an electronic exchange, from or to the component (respectively the discharging or charging step) and thus makes it possible to store the energy within the structure (referred to as nano-battery) or to deliver it, for example, to an outside circuit. This energy takes the form of a current/voltage pair. More particularly, the component acts as a source of voltage that discharges a certain current, i.e. it delivers a quantity of charge that corresponds to a given current for a certain duration (the discharge time). The component designed according to an arrangement specific for the carrying out of an information storage function then carries out an energy storage function.

FIGS. 5 to 11 show certain physical characteristics of electrochemical components, designed to the origin as memories, which are used by the method of the invention in order to use these same components as batteries.

Figure 5:
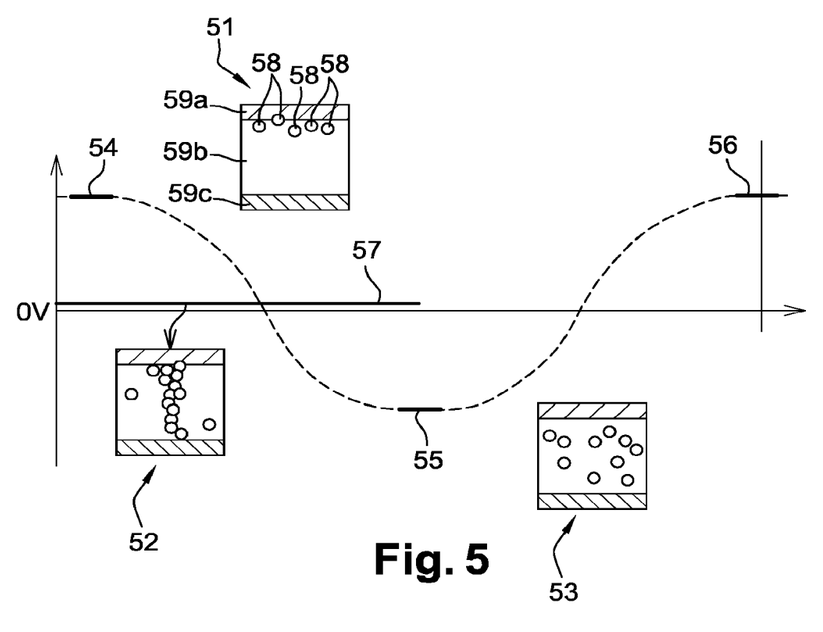
FIG. 5 diagrammatically shows the change in the values of emf corresponding to the two states of an electrochemical component of the CBRAM memory type.

FIG. 5 diagrammatically shows the expected changes in the value of emf corresponding to two separate states of an electrochemical component of the CBRAM memory type used for energy storage. The emf resulting from a gradient of concentration in metal ions between the two electrodes, it is possible to obtain a high value of emf (whether it is positive or negative) in the reduced state of the electrode W and reciprocally to obtain a high value of emf but of the opposite sign in the oxidised state of this same electrode.

The reduced state 51 shown in FIG. 5 shows the metal electrode W 59a and the electrode C 59c. The active area of the resistive memory 59b contains ions coming from the electrode W diagrammatically shown by circles 58. The value of emf associated with this state is called high emf 54 and corresponds to the charged state of a battery.

Reciprocally, the oxidised state 53 will generate the diffusion of the metal ions coming from the electrode W in the active area. The value of emf associated with this state is called low emf 55 and corresponds to the discharged state of a battery. The curve as a dotted line shows the fact that this switching is cyclical and reversible. Thus the state corresponding to the high emf 56 is identical to that corresponding to the high emf 54.

The line 57 shows the fact that the creation of a conductive path 52 in the active area generates a short-circuit and consequently annihilates the emf. Using the switching between two values of emf in order to obtain the capacity of storing energy therefore requires avoiding the creation of such a conductive path and involves the selective use of the component as energy storage or as information storage.

Figure 6:
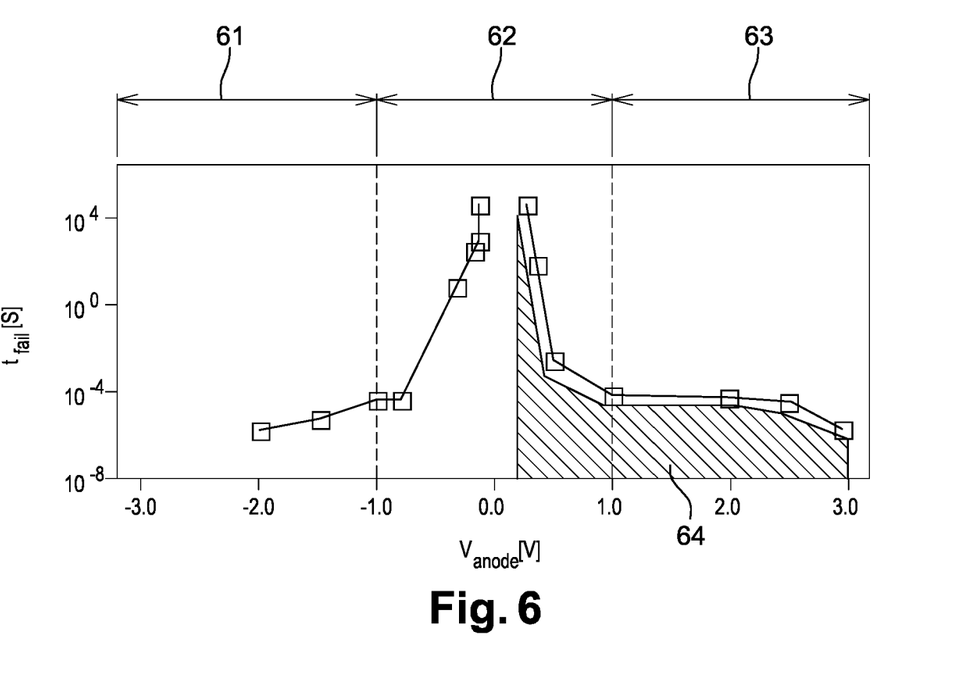
FIG. 6 shows a dependence curve of the characteristics of the duration and of the pulse voltage allowing for the switching between the states of a component of the CBRAM memory type.

FIG. 6 shows a dependence curve of the characteristics of the duration and of the voltage, respectively in seconds and in volts, of pulses that allow for the switching between the states of a memory component of the resistive memory type CBRAM. The area 61 covers the pulse characteristics that make it possible to carry out the RESET operation of the memory while the area 63 covers the pulse characteristics that make it possible to carry out the SET operation of the memory. The intermediate area 62 corresponds to an area, called the "Read Disturb" area, where the pulse characteristics are unsuitable for good use of this type of memory components.

The external voltage (or bias) applied to the component in order to operate the memory function is therefore, in the case described for this embodiment, a negative voltage for the RESET operation and a positive voltage for the SET operation.

As described hereinabove, being able to operate the component as a battery, i.e. for energy storage is based on the occurrence of oxidation-reduction reactions. The oxidation must be carried out without causing the creation of a conductive path (a filament for example) in the active area located between the two electrodes of the component. This involves using control pulses of which the characteristics of duration and of voltage are specific.

The area 64 in FIG. 6 therefore covers all of the pulse characteristics that can be used to obtain an oxidation reaction of the electrode W leading to the injection of ions coming from this electrode in the active area without causing the creation of a conductive path. This makes it possible to switch to the low emf state (associated with the oxidised state).

The reduction reaction that allows for the switching to the high emf state (associated with the reduced state) does not impose any restrictions on the characteristics of duration and of the voltage of the control pulse. In the case of the embodiment shown in FIG. 6, this must only be a negative voltage.

Figure 7A:
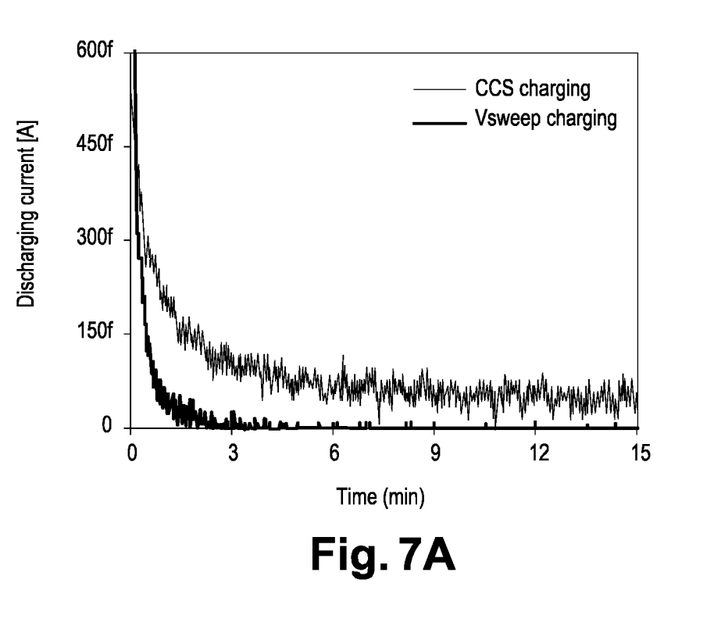
FIGS. 7A and 7B show the energy available (extracted from the discharging curves) for a component used for energy storage according to the various conditions used for the charging thereof.
Figure 7B:
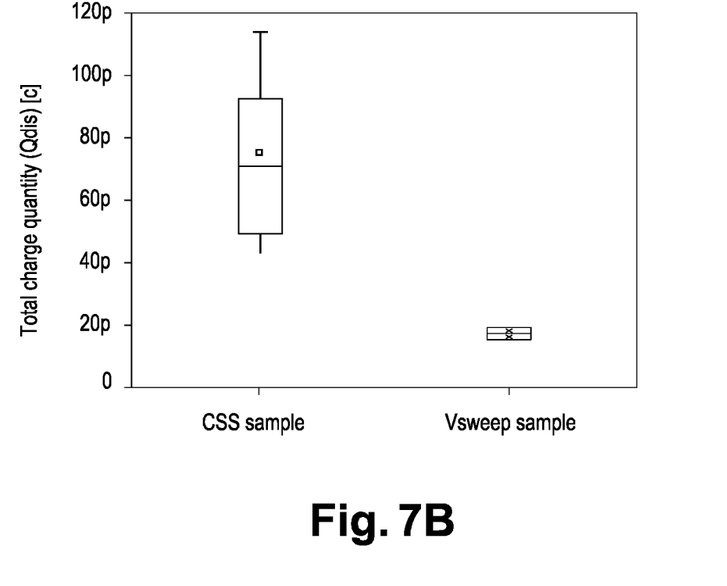

FIGS. 7A and 7B show the energy available for a component used for energy storage according to the various conditions used for the charging thereof. FIG. 7A shows the discharging of the current after the occurrence of the reduction process in the cases where the conditions for charging are those of a stress in voltage, in black, or of constant current stress (CCS), in red. FIG. 7B shows the total quantity of charge available (Qdis) for the two charging conditions described in FIG. 7A.

Figure 8:
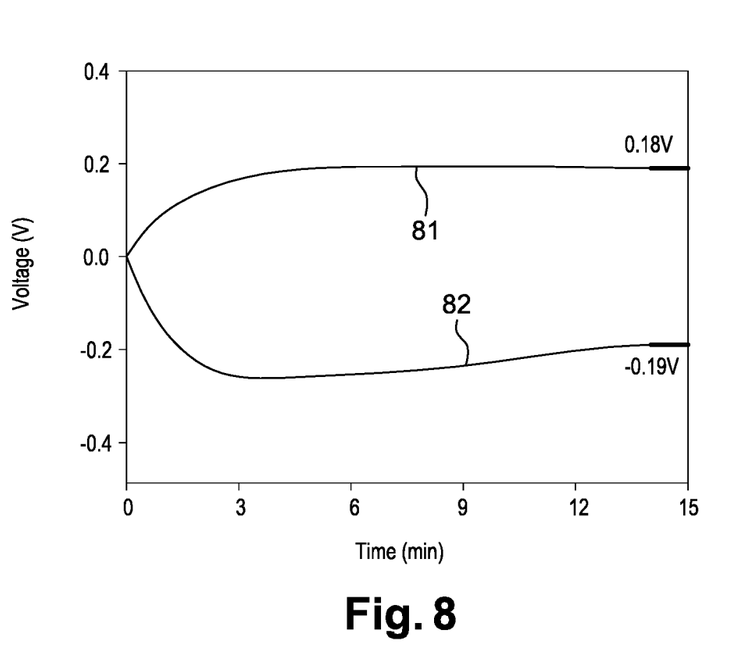
FIG. 8 shows the change over time in the value of emf for the two states required for the operation of an electrochemical component for energy storage.

FIG. 8 shows the change over time in the value of emf (in volts) for the two states required for the operation of the component as energy storage. This is an embodiment based on an arrangement of materials of the CuTe2Ge/Ta$_2$O$_5$/W type for a memory of the CBRAM type. The curve 81 describes the change over time in the value of emf corresponding to the oxidised state until converging towards a stable state, the high emf state defined earlier, having a given value of emf, here 0.18V. The curve 82 describes the same behaviour for the reduced state at the low emf state having a value of emf of −0.19V. The difference between these two values (0.37V) corresponds to a quantity of energy that the component can store. It is to be noted that the active surface of this component is about 2.2 µm².

Figure 9:
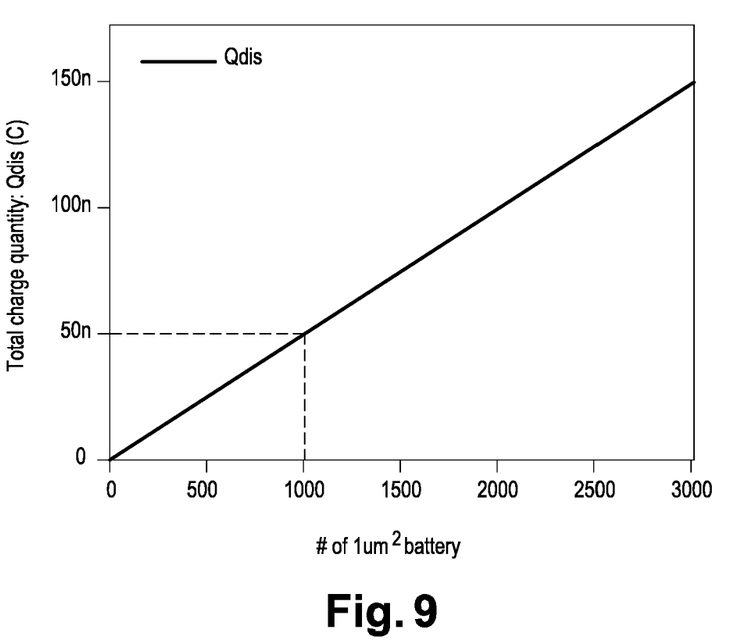
FIG. 9 shows the total quantity of charge available on a circuit that incorporates a number of components of a surface of 1 $\mu m^2$.

FIG. 9 shows the total quantity of charge available on a circuit that incorporates a number of components of a surface of 1 µm² of which the arrangement is identical to that of the component leading to the results presented in FIG. 8. For example, for a thousand elementary components, each one having a surface of 1 µm², the quantity of energy stored is 50 nC.

Figure 10:
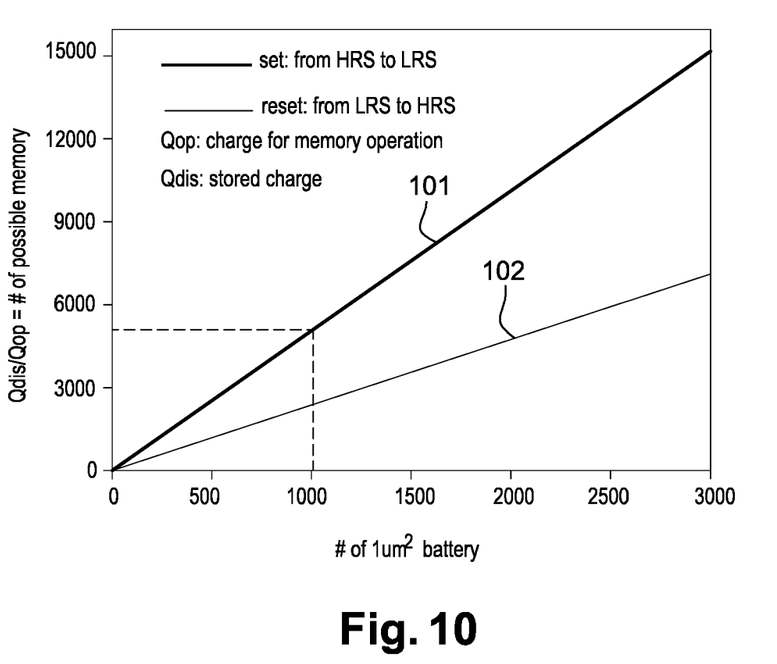
FIG. 10 shows the expected number of components incorporated in a single circuit that have to be operated in order to carry out the energy storage in order to be able to operate a given number of components dedicated to information storage.

FIG. 10, uses in particular the data coming from FIG. 9, in order to show the expected number of components incorporated in a single circuit that have to be operated in order to carry out an energy storage function in order to operate a given number of components, incorporated in the same circuit, and dedicated to information storage. In other words, how many battery components have to be used in order to operate memory components of the same circuit.

As the energy required is not the same for the SET and RESET operations of a memory, these two operations are represented by two different curves: the curve 101 for the Set operation and the curve 102 for the RESET operation.

The curve 101 therefore represents, from the ratio between the total charge available (Qdis) for a certain number of batteries (of a known surface) and the charge required to operate a certain number of memories, the number of memories that can be operated by a given number of batteries for the SET operation. The curve 102 shows the same information for the RESET operation. These curves make it possible to determine that, in the case corresponding to the embodiment shown in FIGS. 8, 9 and 10, one thousand components operated for energy storage can make it possible to carry out the SET operation for five thousand memory components.

Figure 11A:
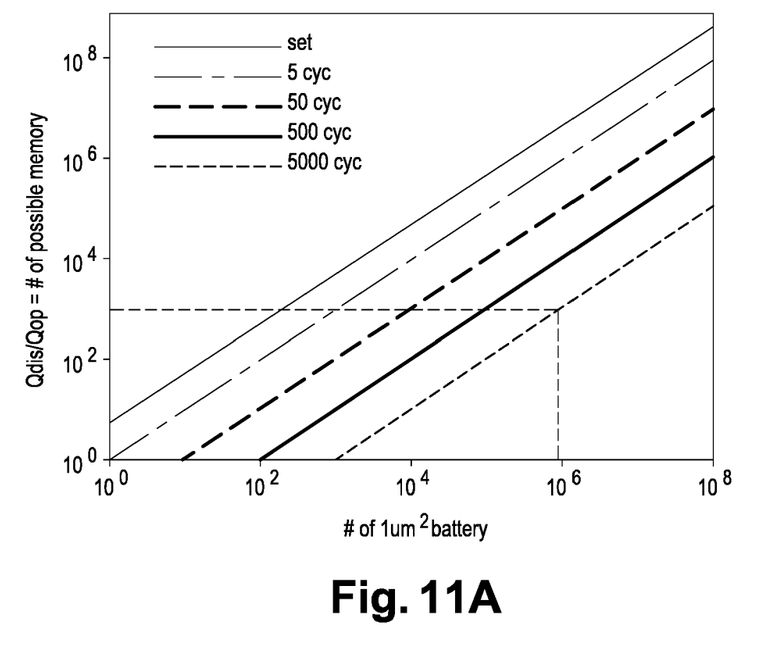
FIGS. 11A and 11B show the correlations between a number of components used for energy storage, a number of components used for information storage and a number of switching cycles between two states of resistance.
Figure 11B:
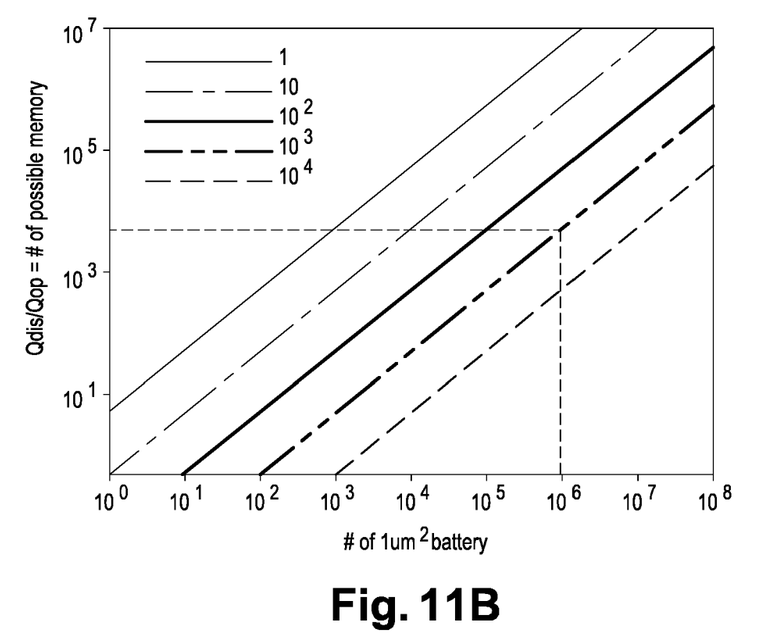

FIGS. 11A and 11B show, using the data from the preceding Figures, the correlations between a number of components used for energy storage, a number of components used for information storage and a number of switching cycles between the two resistance states corresponding to the operation of the memory components. FIG. 11A shows this data on a logarithmic scale and FIG. 11B as a semi-logarithmic scale.

FIGS. 7 to 11 concretely show, for electrochemical components of the resistive memory type, the operating characteristics required (values of high and low emf, total charge available, operating cycles . . . ) in order to be able to be used for energy storage.

Figure 12:
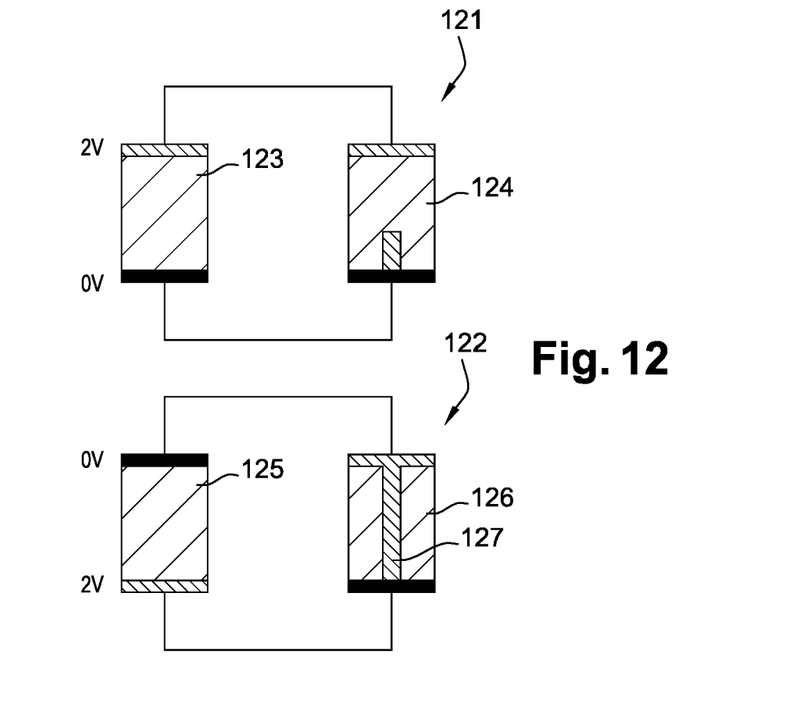
FIG. 12 is a simplified illustration of the connections that can be established in order to make it possible to operate a pair of components that respectively carry out the functions of energy storage and of information storage.

FIG. 12 is a simplified illustration of the connections able to be established in order to make it possible to operate a pair of components formed from an identical arrangement and respectively carrying out the functions of energy storage (battery component) and of information storage (memory component). In particular, the example shown is that of a memory of the CBRAM type of which the operation requires the application of positive and negative external voltages in order to carry out the switching between the two states of the memory.

Two types of connexions are represented with a first connection configuration 121 intended for the carrying out of the SET operation of the CBRAM memory and a second connection configuration 122 intended for the carrying out of the RESET operation of the memory.

According to the cases, the sign of the voltage applied from the battery component is therefore inverted: a positive voltage obtained from the battery component 123 in the configuration 121 and a negative voltage obtained from the battery component 125 in the configuration 122.

These external voltages applied lead to the switching from the HRS state to the LRS state of the memory component 124 and to the switching from the LRS state to the HRS state of the memory component 126 having a conductive path 127 before this switching.

It is important to note that FIG. 12 is a simplified illustration of connections carried out between different components. As such no representation of entities dedicated to power management or switching systems that make it possible to deliver a voltage and a current that are adapted, required for the actual operation of such configurations, is made.

Figure 13:
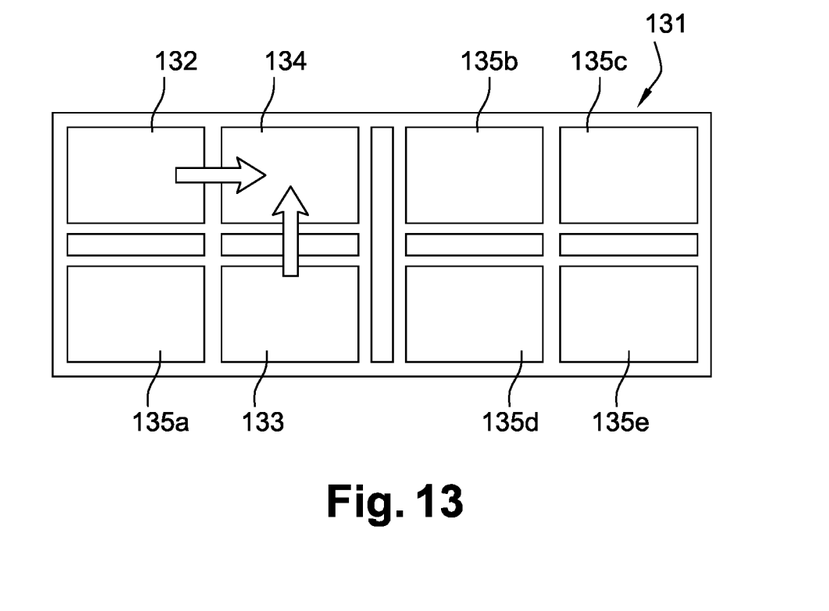
FIG. 13 shows another embodiment of the circuit according to the invention.

Finally, FIG. 12 shows the possibility, using components formed from the same arrangement and incorporated in the same circuit to use a portion of the components as memories, the other portion as batteries and possibly these battery components in order to supply and/or operate the memory components by supplying them, for example, with a programming current and a control voltage required for such operations FIG. 13 shows another embodiment of the circuit according to the invention wherein a set of electrochemical components, formed from the same arrangement and manufactured according to the same method of manufacture, are incorporated in a single circuit 131. Using the method 1 of the invention, a portion of the components, i.e. the components 132 and 133 are used as components for energy storage, and a portion of the components, i.e. the component 134, is used as a component for information storage. In addition, the components used for energy storage provide this energy and operate the component 134. Finally a set of components incorporated in the circuit, the components 135a to 135e, is left in its initial state in such a way as to be able, via application of the method of the invention, determine the use of these components (either for energy storage, or for information storage) according to the needs of a user of such a circuit.

Figure 14:
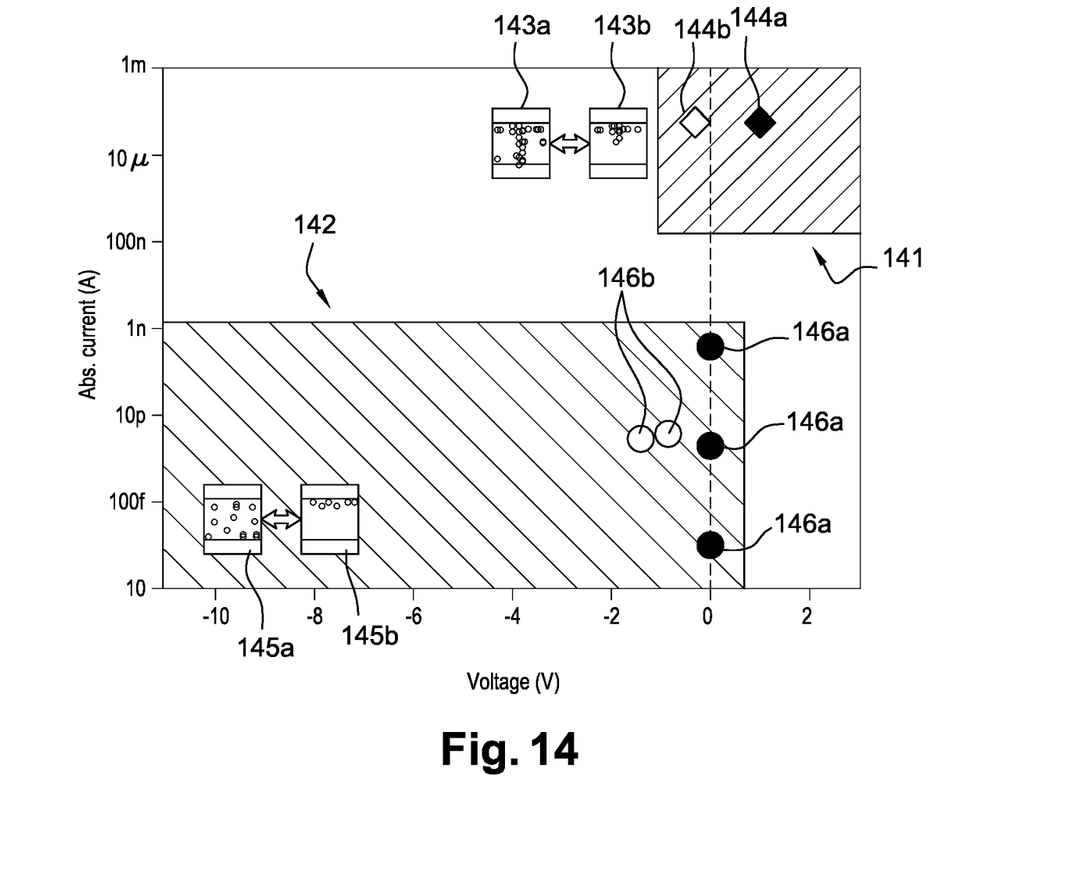
FIG. 14 shows the operating areas in current and in voltage for a single component operated either as a memory or as a battery.

FIG. 14 shows a graph illustrating an example of operating areas in current and in voltage for a single component, in accordance with the invention, operated either as a memory or as a battery.

The area 141 represents the values of current and of voltage applied to the component for which the component can be operated for information storage, i.e., as a memory. The area 142 represents the values of current and of voltage applied to the component for which the component can be operated for energy storage, i.e., as a battery.

When it is in the "memory mode", the component switches from one logic state to another through the formation and the dissolution of a filament in the intermediate area. Inserts 143a and 143b show this reciprocal switching from one state to another (set and reset operations).

Within this current/voltage area of operation as a memory, the points 144a and 144b correspond respectively to a component that successively switches from a high resistance state HRS 144a to a low resistance state LRS 144b which then alternate in a reproducible manner during the operation of the memory.

When it is in the "battery mode", the component switches from one value of emf to another value of emf by the volume diffusion of ions in the intermediate area without forming a filament. Inserts 145a and 145b show this reciprocal switching from one state to another.

Within this current/voltage area of operation as a battery, the points 146a and 146b correspondent respectively to two separate values of emf (of which one is zero) of which the switching allows for the change in the charge state of the battery.

Figure 15:
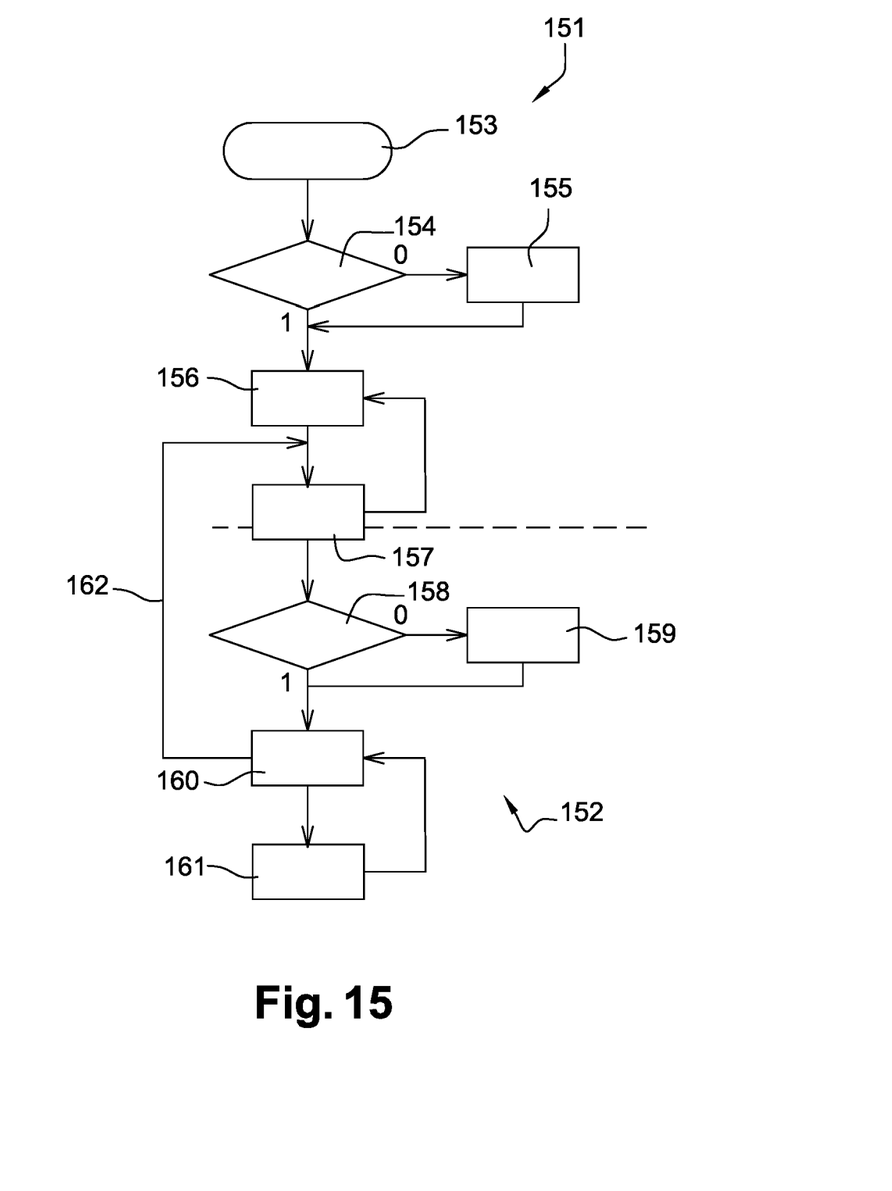
FIG. 15 shows a block diagram that shows the various steps/actions that allow for the use of the same component as a memory or as a battery.

FIG. 15 shows a block diagram that shows the various operation modes of a component in accordance with the invention able to be used as a memory or as a battery and the steps/actions that allows for these two uses.

The portion 151 corresponds to the operation of the component as a battery and the portion 152 corresponding to the operation of the component as a memory.

The block 153 represents the initial resistive state from which the component can be operated in one mode or the other. The step 154 consists in verifying the presence of ions charged in the active area. In the negative, the diffusion of these ions 155 is done via oxidation reaction before being able to proceed with the operation of the battery. In the affirmative, the battery is operated by alternating charge and discharge, in a reproducible manner, respectively via steps during which intervene reduction reactions 156 and des oxidation reactions 157.

The switching to a mode of operation of the component as a memory takes place after a step of verification of the occurrence of the process of forming 158. If the process has not taken place, it can be triggered by the application of a specific voltage intended to trigger this process as shown in block 159.

If the process has taken place, the component can be operated as a memory by the application of a RESET voltage and a SET voltage in order to respectively trigger the RESET 160 and SET 161 operations. These operations are also repeated in a reproducible manner during the operation of the component as memory.

In addition, the arrow 162 shows the possibility of switching again from a mode of operation as memory to a mode of operation as a battery.

The invention claimed is:

1. Method for using a plurality of elementary electrochemical components incorporated in an electronic circuit, said components comprising three layers, formed from the same three materials and having the same thickness, said three layers comprising respectively a first electrode, a second electrode, and an active area between said first and second electrodes, said components able to be used for information storage or for energy storage, said method comprising:
a step in which at least one component is used for information storage via the formation and the dissolution of a conductive path between said first and second electrodes in order to switch said component from a low resistance state to a high resistance state, and reciprocally, by respectively applying a first and a second external voltage to said component;
a step in which at least one other component is used for energy storage via the injection of ions coming from the first electrode and without forming a conductive path, in the active area in order to switch the component from a first high resistance state, associated with a first value of electromotive force, to a second high resistance state, associated with a second value of electromotive force, and reciprocally, by respectively applying a third external voltage different from the first external voltage and/or a first current and a fourth external voltage to said component and/or a second current.

2. The method according to claim 1, wherein the elementary electrochemical component or components incorporated in the electronic circuit and used for energy storage are used for supplying with energy and/or controlling at least one portion of the other electrochemical components used for information storage.

3. The method according to claim 1, wherein at least one elementary electrochemical component is retained in an initial or high resistance state which allows a user of said circuit to choose to use this or these components for information storage or for energy storage.

4. The method according to claim 1, wherein the elementary electrochemical component or components incorporated in the electronic circuit and used for energy storage are used for supplying with energy one or several other integrated circuits on the same chip.

5. Electronic circuit incorporating a plurality of electrochemical components said components comprising three layers, formed from the same three materials and having the same thickness, said three layers comprising respectively a first electrode, a second electrode, and an active area between said first and second electrodes, said components able to be used for information storage or for energy storage, said electronic circuit comprising means for implementing the method according to claim 1.

6. The electronic circuit according to claim 5, wherein said components are formed by an arrangement of layers of materials of the conductive bridging random access memory (CBRAM) type comprising a first soluble metal electrode, a second metal electrode and an electrolyte between said first and second electrodes.

7. The electronic circuit according to claim 5, wherein said components are formed by an arrangement of layers of materials of the oxide resistive random access memory (OxRRAM) type comprising a first electrode, a second electrode and a material with an oxide base between said first and second electrodes.

8. The electronic circuit according to claim 5, wherein the active areas located between said first and second electrodes of said components are comprised of materials chosen from the following materials: sulphide material or silicon oxide or transition metal oxide.

9. The electronic circuit according to claim 5, wherein the surface of said components used for information storage is adapted to supply with energy and to operate components used for information storage that have a predetermined surface and number of operating cycles.

* * * * *